(12) United States Patent
Toya

(10) Patent No.: US 8,994,620 B2
(45) Date of Patent: Mar. 31, 2015

(54) ELECTRO-OPTICAL DEVICE AND ELECTRONIC APPARATUS

(75) Inventor: Takashi Toya, Shimosuwa-machi (JP)

(73) Assignee: Seiko Epson Corporation, Tokyo (JP)

( * ) Notice: Subject to any disclaimer, the term of this patent is extended or adjusted under 35 U.S.C. 154(b) by 222 days.

(21) Appl. No.: 13/470,759

(22) Filed: May 14, 2012

(65) Prior Publication Data

US 2012/0306841 A1 Dec. 6, 2012

(30) Foreign Application Priority Data

Jun. 2, 2011 (JP) ................................. 2011-124197

(51) Int. Cl.
*G09G 3/30* (2006.01)
*G09G 3/32* (2006.01)
*H01L 27/32* (2006.01)

(52) U.S. Cl.
CPC .......... *G09G 3/3225* (2013.01); *H01L 27/3276* (2013.01); *G09G 2300/0842* (2013.01); *G09G 2320/0214* (2013.01)
USPC ......................................................... 345/76

(58) Field of Classification Search
USPC ......................................... 313/498, 504–506
See application file for complete search history.

(56) References Cited

U.S. PATENT DOCUMENTS

| | | | |
|---|---|---|---|
| 2007/0268210 A1 | 11/2007 | Uchino et al. | |
| 2008/0023717 A1* | 1/2008 | Choi et al. | 257/98 |
| 2008/0291223 A1* | 11/2008 | Yamazaki et al. | 345/690 |
| 2010/0079507 A1* | 4/2010 | Yatabe et al. | 345/691 |
| 2010/0182224 A1 | 7/2010 | Iida et al. | |
| 2010/0321422 A1* | 12/2010 | Ishiguro et al. | 345/698 |

FOREIGN PATENT DOCUMENTS

| | | |
|---|---|---|
| JP | A-2007-310311 | 11/2007 |
| JP | 2009-075408 A | 4/2009 |
| JP | 2009-181014 A | 8/2009 |
| JP | A-2010-164801 | 7/2010 |

* cited by examiner

*Primary Examiner* — Quan-Zhen Wang
*Assistant Examiner* — Chad Dicke
(74) *Attorney, Agent, or Firm* — Oliff PLC

(57) ABSTRACT

A pixel circuit is disposed in correspondence to an intersection of a scanning line and a data line. The pixel circuit is provided with a wiring for shielding an relay electrode connected to a source of the transistor for controlling a current flowing to a light emitting element from the data line. The wiring has a structure in which an relay electrode located on the same layer as the data line, an relay electrode located on the same layer as the relay electrode, an electrode portion of a conductive layer between the data line and the relay electrode are electrically connected to each other.

10 Claims, 14 Drawing Sheets

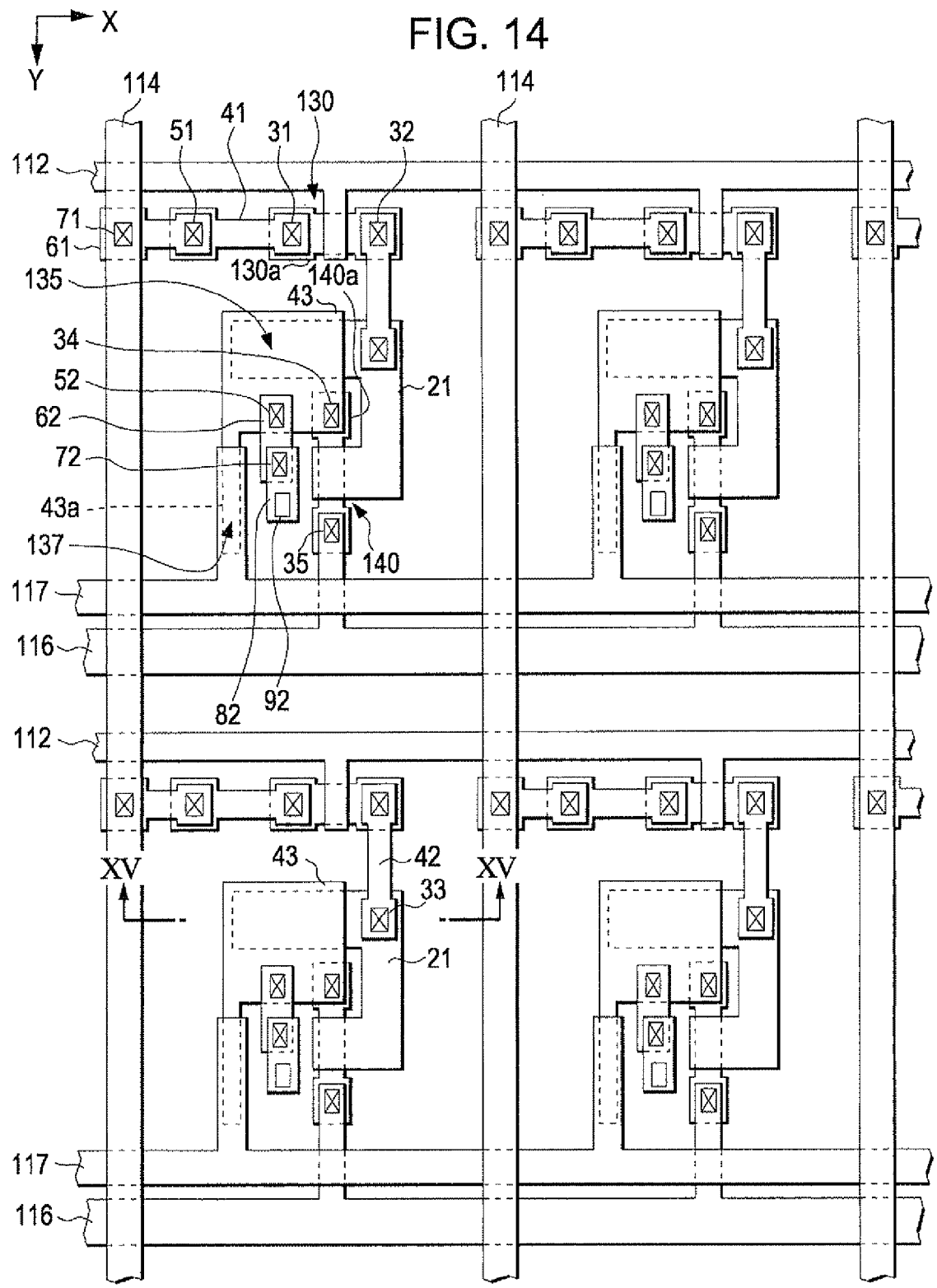

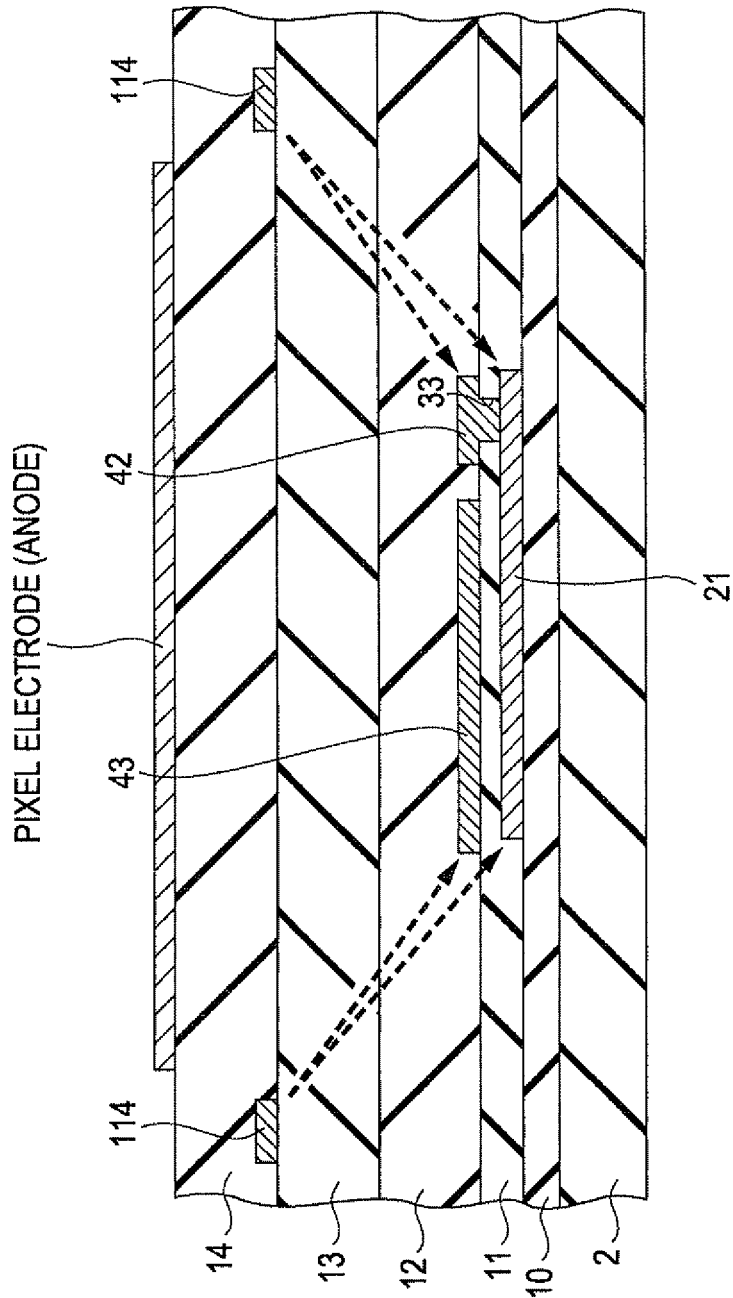

ELECTRO-OPTICAL DEVICE AND ELECTRONIC APPARATUS

BACKGROUND

1. Technical Field

The present invention relates to an electro-optical device and an electronic apparatus which can prevent deterioration of display quality.

2. Related Art

In recent years, various kinds of electro-optical devices employing a light emitting element, such as an organic light emitting diode (hereinafter referred to as OLED), have been proposed. Such an electro-optical device includes pixel circuits respectively disposed in correspondence to the intersection of scanning lines and data lines. The pixel circuits generally include the light emitting elements, switching transistors, and driving transistors (refer to JP-A-2007-310311).

However, as miniaturization and increasingly high definition display of the electro-optical device continue, the data lines and the driving transistors get approached each other, so that the degree of capacitive coupling is increased. For this reason, if the data lines are subjected to potential fluctuation, the potential fluctuation of the respective parts, particularly the holding potential of the gate, of the driving transistors fluctuated via parasitic capacitance. Accordingly, since an intended current becomes unable to flow to the light emitting elements, the display quality consequently deteriorates.

SUMMARY

An advantage of some aspects of the invention is to prevent deterioration of display quality which is caused by potential fluctuation in a data line.

According to one aspect of the invention, there is provided an electro-optical device including: a scanning line and a data line that intersect one another; and a pixel circuit that is disposed in correspondence to intersection of the scanning line and the data line, wherein the pixel circuit includes a driving transistor supplying a current according to a voltage between a gate and a source to the source from a drain, a switching transistor electrically connected between the gate of the driving transistor and the data line, a first capacitor holding a voltage between the gate and the source of the driving transistor, a light emitting element having an anode which is connected to the source of the driving transistor, and emitting light according to the current flowing from the anode to a cathode, and a second capacitor having one end connected to the source of the driving transistor and the other end connected to a feed line, and the feed line is made of a wiring layer between a wiring layer forming the gate of the driving transistor and a wiring layer forming the data line, and has an electrode portion located between the data line and the gate of the driving transistor when seen in plan view.

In the invention, an electrode portion extending from the feed line is positioned between the data line and the gate of the driving transistor when seen in plan view. Since the feed line and the electrode portion thereof is made of a wiring layer between the wiring layer forming the gate of the driving transistor and the wiring layer forming the data line, the gate of the driving transistor is shielded from the data line. Therefore, the invention can prevent deterioration of the display quality which is caused by a potential fluctuation in the data line.

According to one aspect of the invention, it is desirable that the electro-optical device includes a first relay electrode that is overlapped with a portion of a gate electrode forming the gate of the driving transistor, and electrically connected to the source of the driving transistor when seen from a plan view, wherein an electrode portion of the feed line is overlapped with a portion of the first relay electrode when seen in plan view, the first capacitor interposes a first interlayer dielectric film between the gate electrode and the first relay electrode, and the second capacitor interposes a second interlayer dielectric film between the first relay electrode and the electrode portion of the feed line. According to the aspect, the potential fluctuation in the data line has hardly an influence on the source of the driving transistor connected to the first relay electrode, as well as the gate of the driving transistor.

According to this aspect, it is desirable that the electro-optical device includes a second relay electrode that is formed of a wiring layer forming the data line, and is provided between the data line and the gate electrode when seen in plan view, wherein the second relay electrode is electrically connected to the electrode portion of the feed line via a contact hole. With the configuration, since the data line is made of the same layer as the data line, the data line is shielded by the second relay electrode at almost the same potential as the feed line, so that it can be less susceptible to influence by the potential fluctuation in the data line.

In this configuration, it is desirable that the electro-optical device includes a third relay electrode that is formed of the same layer as the first relay electrode, and is overlapped with the second relay electrode when seen in plan view, wherein the third capacitor is electrically connected to the electrode portion of the feed line via a contact hole. According to this aspect, by the structure in which the third relay electrode made of the same layer as the first relay electrode, the electrode portion of the feed line, and the second relay electrode made of the same layer as the data line are electrically connected to each other, the driving transistor is shielded from the data line in the cross-sectional direction, as well as the planar direction.

In the invention, it is desirable that during an initializing period, a potential of the drain of the driving transistor is set to a first power potential, and the gate of the driving transistor is supplied with an initializing potential via the data line and the switching transistor to initialize a potential of the source of the driving transistor; during a setting period, a potential of the power line is set to a second power potential to hold a voltage corresponding to a threshold voltage of the driving transistor between the gate and the source of the driving transistor in a state in which the light emitting element does not emit light; during a writing period, the gate of the driving transistor is supplied with a potential according to a gradation via the data line and the switching transistor; and a set current flows in the second capacitor at least from the setting period to the writing period.

In addition, the electro-optical device according to the invention can be applied to various kinds of electronic apparatuses. Typically, the display device is a personal computer or a cellular phone as the electronic apparatus. In particular, according to the invention, since the potential fluctuation in the data line has hardly any influence on the potential of the gate (source) of the driving transistor in the pixel circuit, this can prevent deterioration of the display quality. Thus, for example, it is suitable for a compact display device such as a head-mounted display or a projector. First of all, an application of the electro-optical device according to the invention is not limited to the display device. For example, it can be applied to an exposure device (optical head) for forming a latent image onto an image carrier, such as a photoreceptor drum, by irradiation of light beams.

BRIEF DESCRIPTION OF THE DRAWINGS

The invention will be described with reference to the accompanying drawings, wherein like numbers reference like elements.

FIG. 14 is a plan view of a main part illustrating the configuration of pixel circuits according to a comparative embodiment.

FIG. 15 is a partial cross-sectional view illustrating the configuration taken along the line XV-XV in FIG. 14.

DESCRIPTION OF EXEMPLARY EMBODIMENTS

Below, an electro-optical device according to an embodiment of the invention will be described with reference to the accompanying drawings.

Figure 1:
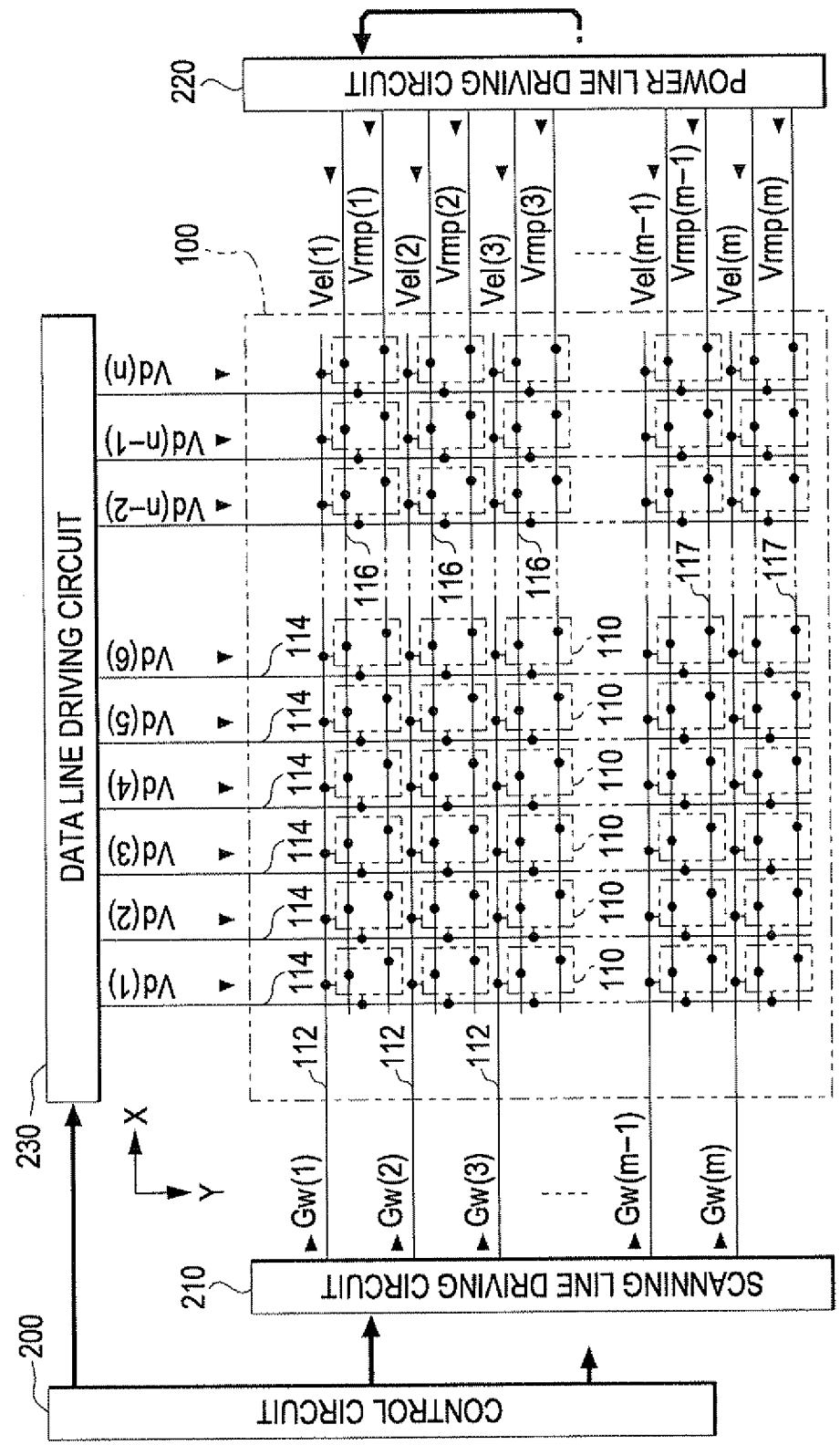
FIG. 1 is a block diagram illustrating the configuration of an electro-optical device according to an embodiment.

FIG. 1 is a block diagram illustrating the configuration of an electro-optical device according to an embodiment.

As illustrated in the drawing, an electro-optical device 1 includes a display section 100, a scanning line driving circuit 210, a power line driving circuit 220, and a data line driving circuit 230.

Of these, the display section 100 is provided with m rows of scanning lines 112 arranged in a horizontal (X) direction in the drawing, and n columns of data lines 114 arranged in a vertical (Y) direction and electrically insulated from the scanning lines 112, respectively.

The pixel circuits 110 respectively represent one pixel of an image to be displayed, and are respectively disposed in correspondence to the intersection portion between the m rows of scanning lines 112 and the n columns of data lines 114. In this embodiment, therefore, the pixel circuits 110 are arranged in a matrix state, so that an image of n horizontal pixels×m vertical pixels is displayed. In addition, both m and n are a positive integer.

The display section 100 is provided with a discrete power line 116 and a discrete electric supply line 117 for every row. In addition, although not illustrated in FIG. 1, a common electrode is provided across the respective pixel circuits 110, which will be described below, to supply a potential Vct of a low-potential side of a device power source thereto.

In addition, in order to conveniently distinguish the rows of the scanning lines 112 and the pixel circuits 110, there are cases where the rows are referred to as $1^{st}$, $2^{nd}$, $3^{rd}$, ..., (m−1)-th, or m-th row in order from the top in FIG. 1. In the same way, in order to conveniently distinguish the columns of the data lines 114 and the pixel circuits 110, there are cases where the columns are referred to as $1^{st}$, $2^{nd}$, $3^{rd}$, ..., (n−1)-th, or n-th column in order from the left in FIG. 1.

On the periphery of the display section 100 in which the pixel circuits 110 are arranged in the matrix state, the electro-optical device 1 is provided with a control circuit 200, the scanning line driving circuit 210, the power line driving circuit 220, and the data line driving circuit 230.

The control circuit 200 controls the operation of the scanning line driving circuit 210, the power line driving circuit 220, and the data line driving circuit 230, and also supplies gradation data for specifying a gradation (luminance) of a pixel to be displayed by each pixel circuit 110 to the data line driving circuit 230.

The scanning line driving circuit 210 supplies scanning signals Gw(1), Gw(2), Gw(3), ..., Gw(m−1), Gw(m) to the $1^{st}$, $2^{nd}$, $3^{rd}$, ..., (m−1)-th, and m-th row scanning lines 112, respectively, to sequentially scan the $1^{st}$ to m-th row for every frame. In addition, herein, a frame means a period needed to form a complete image on the electro-optical device 1. If a vertical scanning frequency is 60 Hz, the frame means a period of 16.67 milliseconds for each cycle.

The power line driving circuit 220 supplies signals Vel(1), Vel(2), Vel(3), ..., Vel(m−1), Vel(m) to the $1^{st}$, $2^{nd}$, $3^{rd}$, ..., (m−1)-th, and m-th row power lines 116, respectively, and converts the potential of the signal into a potential Vel_L of a low-potential side and a potential Vel_H of a high-potential side in synchronization with the scan performed by the scanning line driving circuit 210. In addition, the power line driving circuit 220 supplies ramp signals Vrmp(1), Vrmp(2), Vrmp(3), ..., Vrmp(m−1), Vrmp(m) to the $1^{st}$, $2^{nd}$, $3^{rd}$, ..., (m−1)-th, and m-th row feed lines 117, respectively, in synchronization with the scan performed by the scanning line driving circuit 210.

Furthermore, it can be applied to a mode, in which a fixed potential is supplied to the feed lines 117 at least during a predetermined period, depending upon a method for driving the pixel circuits.

The data line driving circuit 230 supplies a data signal of an initial potential or a potential according to gradation data of the pixel circuit 110, to the pixel circuit 110 located at the row which is scanned by the scanning line driving circuit 210 via the data line 114. For descriptive purpose, the data signals respectively supplied to the $1^{st}$, $2^{nd}$, $3^{rd}$, ..., (n−1)-th, and n-th column data lines 114 are designated by Vd(1), Vd(2), Vd(3), ..., Vd(n−1), and Vd(n).

Figure 2:
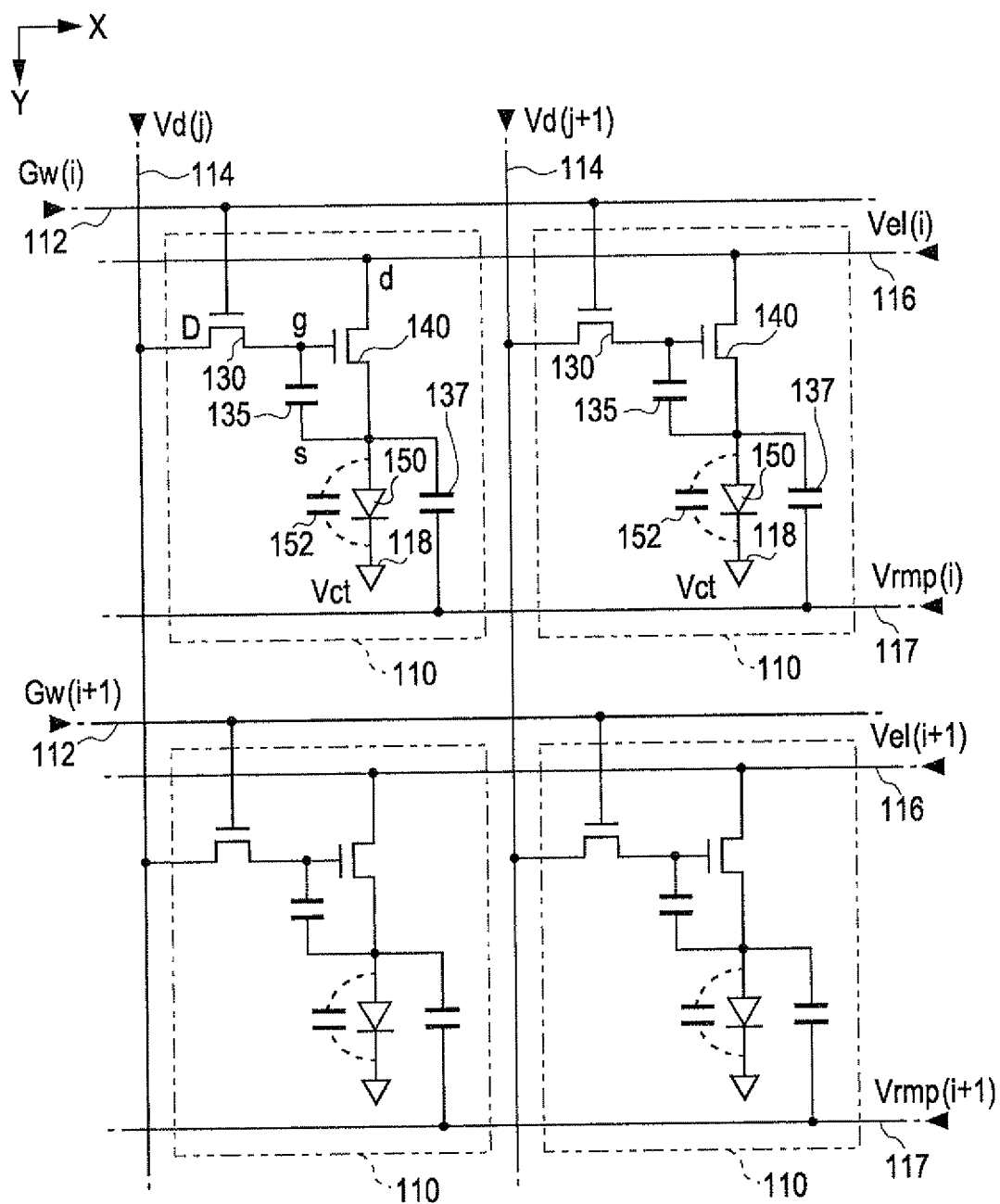
FIG. 2 is a diagram illustrating an equivalent circuit of a pixel circuit in an electro-optical device.

An equivalent circuit of the pixel circuit 110 will now be described with reference to FIG. 2. In addition, FIG. 2 illustrates the pixel circuit 110 of a total of four pixels arrayed 2 by 2 in correspondence to the intersection of the i-th row scanning line 112 and the (i+1)-th row scanning line 112 adjacent to the i-th row, and the j-th column data line 114 and the (j+1)-th column data line 114 adjacent to the j-th column. Herein, i and (i+1) are symbols generally designating a row along which the pixel circuits 110 are arrayed, and are an integer that is 1 or more and m or less. In the same way, j and (j+1) are symbols generally designating a column along which the pixel circuits 110 are arrayed, and are an integer that is 1 or more and n or less.

As illustrated in FIG. 2, each of the pixel circuits 110 includes N-channel transistors 130 and 140, capacitance elements 135 and 137, and a light emitting element 150. Herein, since the respective pixel circuits 110 are identical to each other in terms of the electrical configuration, the pixel circuit positioned at the i-th row and the j-th column will be described as a representative.

In the pixel circuit 110 positioned at the i-th row and the j-th column, the transistors 130 and 140 are a thin film transistor formed by, for example, a low-temperature poly silicon process. Of these, the transistor 130 serves as a switching transistor, in which a gate is electrically connected to the i-th row scanning line 112, a drain is electrically connected to the j-th column data line 114, and a source is respectively connected to one end of the capacitance element 135 and a gate of the transistor 140. The other end of the capacitance element 135 is electrically connected to a source of the transistor 140, one end of the capacitance element 137, and an anode of the light emitting element 150, respectively. The capacitance element 135 serves as a first capacitor for holding a voltage between the gate and the source of the transistor 140.

Meanwhile, the drain of the transistor 140 is connected to the i-th row power line 116. In addition, the other end of the capacitance element 137 is connected to the i-th row feed line 117. The capacitance element 137 serves as a second capacitance element which is electrically interposed between the source of the transistor 140 and the feed line 117.

For descriptive convenience, in the pixel circuit 110 positioned at the i-th row and the j-th column, the drain of the transistor 130 is designated by an upper case "D", while the gate (the source of the transistor 130 and one end of the capacitance element 135) of the transistor 140 is designated by a lower case "g".

In addition, the drain (power line 116) of the transistor 140 is designated by a lower case "d", while the source (one end of the capacitance element 137 and the anode of the light emitting element 150) of the transistor 140 is designated by a lower case "s".

A cathode of the light emitting element 150 is commonly connected to a common electrode 118, which is held at a potential Vct, via the pixel circuit 110. The light emitting element 150 is an OLED having a structure in which a light emitting layer made of an organic EL material is interposed between an anode and a cathode facing each other, and emits light at luminance according to a current flowing from the anode to the cathode. In addition, due to the above construction, a capacitance component 152 is produced between the anode and the cathode of the light emitting element 150.

In FIG. 2, Gw(i) and Gw(i+1) indicate the scanning signal supplied to the i-th and (i+1)-th row scanning lines 112, respectively. Vel(i) and Vel(i+1) indicate the signal supplied to the i-th and (i+1)-th row power lines 116, respectively. Vrmp(i) and Vrmp(i+1) indicate the ramp signal supplied to the i-th and (i+1)-th row feed lines 117, respectively. Also, Vd(j) and Vd(j+1) indicate the data signal supplied to the j-th and (j+1)-th column data lines 114, respectively.

In addition, the gate and the source of the transistor 140 are shielded from the adjacent data line 114 in this embodiment, and its configuration will be described in detail hereinafter.

Figure 3:
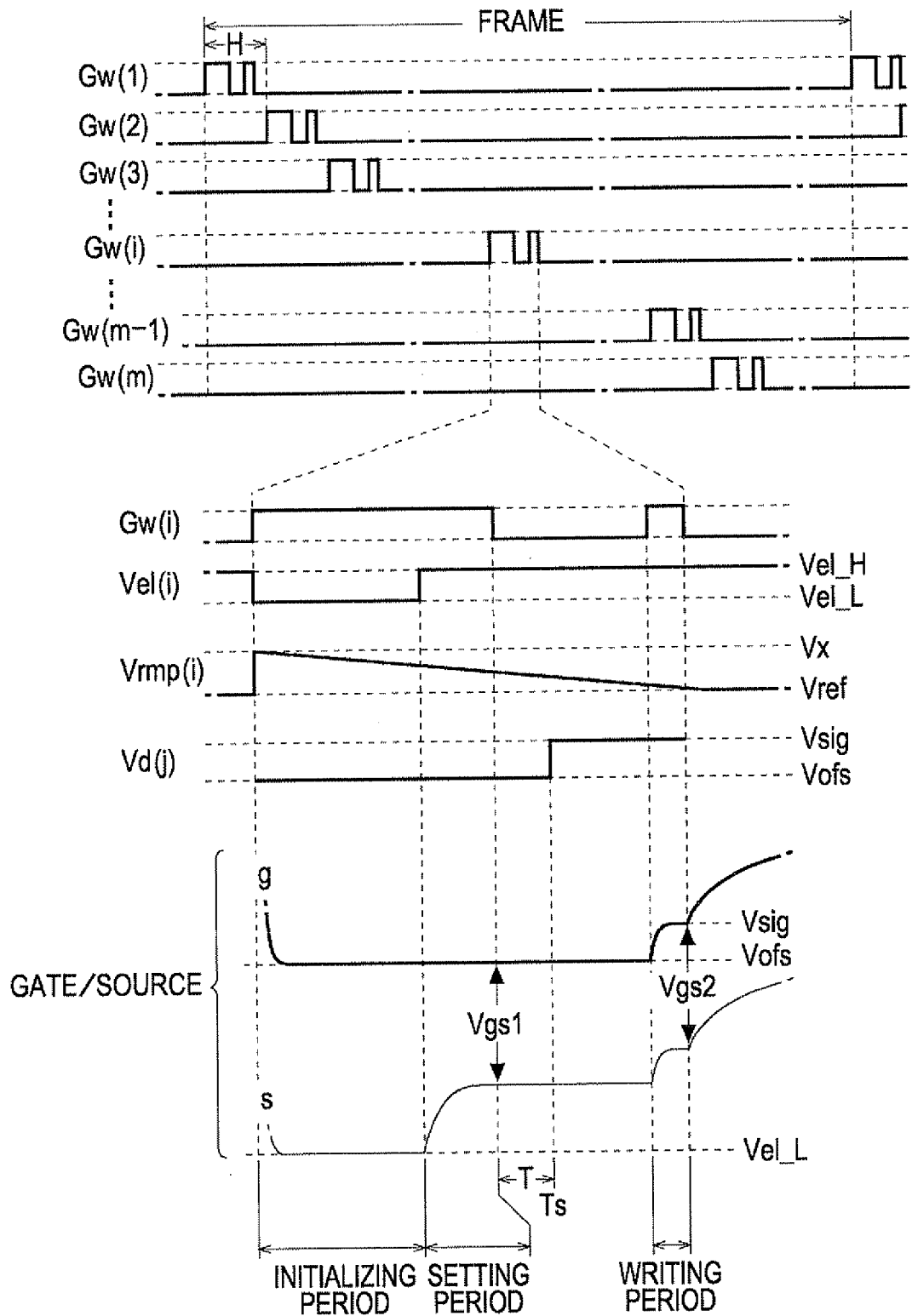
FIG. 3 is a diagram illustrating display operation of an electro-optical device.

The operation of the electro-optical device 1 will now be described with reference to FIG. 3. FIG. 3 is a view for explaining the operation of the respective parts in the electro-optical device 1.

As illustrated in the drawing, the scanning line driving circuit 210 scans the $1^{st}$ to m-th row scanning lines 112 in order for every one horizontal scanning period (H) in one frame by changing the potential of the scanning lines Gw(1) to Gw(m) under the control of the control circuit 200.

The operation during one horizontal scanning period (H) is common over the pixel circuit 110 of each row. Accordingly, hereinafter it will be usually described the j-th column pixel circuit 110 among the i-th row scanning lines 112 when the i-th row scanning lines 112 are scanned.

In this embodiment, the scanning period of the respective scanning lines 112 can be broadly divided into an initializing period, a setting period, and a writing period in order of time. Of these, the initializing period and the setting period are continuous in terms of time, while the setting period and the writing period are discontinuous in terms of time.

Herein, the scanning line driving circuit 210 outputs the following scanning signal Gw(i) under the control of the control circuit 200. That is, the scanning line driving circuit 210 sets the scanning signal Gw(i) in the scanning period of the i-th row scanning line 112 to an H level during the initializing period and the setting period, to an L level during a period from the end of the setting period to the start time of the writing period, again to the H level during the writing period, and to the L level during a period from the end of a writing period to the initializing period of the i-th row in the next frame.

The power line driving circuit 220 outputs the following signal Vel(i) and ramp signal Vrmp(i), respectively, under the control of the control circuit 200.

That is, the power line driving circuit 220 sets the signal Vel(i) supplied to the i-th row power line 116 to a potential Vel_L which is a first power potential during the initializing period, and to a potential Vel_H which is a second power potential after the setting period. In addition, the timing at which the potential Vel(i) is transitioned from the potential Vel_H to the potential Vel_L is set to the start time of the initializing period in FIG. 3, but it may be transitioned to the potential Vel_L at a timing ahead of the initializing period for the purpose of shortening the light emitting period of the light emitting element 150.

In addition, the power line driving circuit 220 linearly decreases the ramp signal Vrmp(i) supplied to the i-th row feed line 117 from the potential Vx to the potential Vref (Vx>Vref) in a period from the start time of the scanning period of the i-th row scanning line 112 to the end time. Furthermore, a difference between the potential Vx and the potential Vref is actually imperceptible, and the influence of the decrease in the potential of the ramp signal Vrmp(i) on the respective parts of the pixel circuit 110 is negligibly small.

The data line driving circuit 230 supplies the following data signals Vdl(1) to Vd(n) to the corresponding data line 114, respectively, under the control of the control circuit 200.

That is, the data line driving circuit 230 sets all the data signals Vdl(1) to Vd(n) to the initializing potential Vofs over the initializing period, the setting period, and the period from the end of the setting period to a timing Ts after a lapse of a time T, so that it becomes a potential according to gradation data designated for pixels corresponding to the intersection of the i-th row and the $1^{st}$ to n-th columns until the scanning period of the next (i+1)-th row scanning line 112 is initialized from the timing Ts.

For this reason, for example, the data signals Vd(j) supplied to the j-th column data line 114 are set to the initializing potential Vofs over the period from the start of the initializing period to the timing Ts, as illustrated in FIG. 3, so that it becomes a potential Vsig according to gradation data designated for the i-th row and j-th column pixel circuit 110 over the period until the scanning period of the next (i+1)-th row scanning line 112 is initialized from the timing Ts.

During the initializing period of the i-th row, since the potential Gw(i) of the scanning signal is transitioned to the H level, and then the transistor 130 is turned on, the gate g of the transistor 140 is electrically connected to the data line 114. Since the data signal Vd(j) supplied to the data line 114 is set to the potential Vofs during the initializing period, the gate g is also set to the potential Vofs.

Meanwhile, the signal Vel(i) supplied to the i-th row power line 116 is the potential Vel_L. In this embodiment, a differential voltage (Vofs-Vel_L) obtained by reducing the potential Vel-L from the potential Vofs is set to be sufficiently higher than a threshold voltage Vth_tr of the transistor 140.

For this reason, since the transistor 140 is in a driving state during the initializing period, the source s (anode of the light emitting element 150) of the transistor 140 is initialized at the potential Vel_L.

Accordingly, the voltage between the gate g and the source s of the transistor 140, that is, the voltage held by the capacitance element 135, is initialized by the differential voltage between the potential Vofs and the potential Vel_L.

In addition, since the potential Vel_L is set so that a potential difference between the potential Vel_L and the potential Vct of the common electrode 118 becomes a value falling below the light emitting threshold voltage Vth_oled of the light emitting element 150, the light emitting element 150 is in an OFF state (non-emissive state) during the initializing period.

Next, since the scanning signal Gw(i) is continuously the H level during the i-th row setting period, the ON state of the transistor 130 is constantly maintained, and thus the gate g of the transistor 140 is held at the initialized potential Vofs.

Since the signal Vel(i) is transitioned to the potential Vel_H of the high-potential side at the start time of the setting period, as a result of the current flowing from the power line 116 to the drain d and the source s of the transistor 140, the potential of the source s starts to rise. Since the gate g is held at the initializing potential Vofs in the transistor 140, the voltage between the gate and the source is gradually decreased.

In this instance, when the potential of the ramp signal Vrmp(i) is changed over time, the current flowing between the drain d and the source s of the transistor 140 is divided into both the light emitting element 150 side and the capacitance element 137 side.

Of these, the current flowing to the light emitting element 150 side flows to the capacitance component 152 of the light emitting element 150, and then starts to charge the capacitance component 152. If the charging is completed quickly, the current flowing between the drain d and the source s of the transistor 140 does not flow to the light emitting element 150 side, but flows only to the capacitance element 137 side.

Meanwhile, if the current flowing to the capacitance element 137 side is referred to as a set current, the potential of the ramp signal Vrmp(i) is linearly decreased in this embodiment, and the decrease rate is constant. For this reason, after the charging of the capacitance component 152 is completed, the set current flowing along a route of the power line 116→the drain d→the source s→the capacitance element 137 is almost constant.

At the end of the setting period, the voltage between the gate and the source of the transistor 140 is substantially equal to the voltage Vgs1 sufficient for the set current to flow in the transistor 140. For this reason, the source s of the transistor 140 is set to a potential (Vofs−Vgs1) which is lower than the initializing potential Vofs (potential of the gate g) by the voltage Vgs1. In this embodiment, the difference between the potential (Vofs−Vgs1) and the voltage Vct, that is, the voltage across both ends of the light emitting element 150, is set to fall below the light emitting threshold voltage Vth_oled of the light emitting element 150. Accordingly, the light emitting element 150 is in the non-emissive state even in the setting period.

In addition, the voltage Vgs1 will be represented by the following Equation 1:

$$Vgs1 = Vth\_tr + Va \quad (1)$$

In Equation 1, Vth_tr is a threshold voltage of the transistor 140, and Va is a voltage corresponding to the set current. For this reason, during the setting period, the voltage between the gate and the source of the transistor 140 seems to be set to the voltage corresponding to the threshold voltage of the transistor 140.

Subsequently, if the i-th row setting period is completed, the scanning signal Gw(i) is transitioned to the L level, and thus the transistor 140 is in an OFF state, so that the gate g of the transistor 140 is in a floating (high impedance) state.

Even if the setting period is completed, the potential of the ramp signal Vrmp(i) is linearly decreased, and thus the set current continuously flows in the capacitance element 137.

Herein, as a mobility μ of the transistor 140 is high, the value of the current flowing in the transistor 140 is increased, so that an amount of increase in the potential of the source is also increased. On the contrary, as the mobility μ is low, the value of the current flowing in the transistor 140 is decreased. In other words, as the mobility μ is high, an amount of decrease (amount of negative feedback) in the voltage between the gate and the source of the transistor 140 is increased. As the mobility μ is low, the amount of decrease (amount of negative feedback) in the voltage between the gate and the source of the transistor 140 is decreased. Even though the mobility μ of the transistor 140 is varied for every pixel circuit 110, it is configured to compensate for the difference.

In this embodiment, as illustrated in FIG. 3, the data signal Vd(j) supplied to the j-th column data line 114 is varied to the potential Vsig according to the gradation data from the initializing potential Vofs at the timing Ts after a lapse of the time T from the end of the setting period.

During the writing period of the i-th row, the potential Gw(i) of the scanning signal is again transitioned to the H level, and thus the transistor 130 is turned on. As a result, the gate g of the transistor 140 is electrically connected to the data line 114, and thus is set to the potential Vsig of the data signal Vd(j). For this reason, since the current according to the potential Vsig flows from the drain d of the transistor 140 to the source s, the potential of the source s is increased.

Meanwhile, since the potential of the ramp signal Vrmp(i) is continuously decreased, the current flows in the capacitance element 137. If so, the current flowing from the drain d to the source s in the transistor 140 is divided into capacitance element 135 and the capacitance element 137 to flow therein.

In this instance, as the current flowing in the transistor 140 according to the potential Vsig is high, the current flowing in the capacitance element 135 is increased. As a result, the amount of increase (that is, the amount of decrease in the voltage between the gate and the source) in the potential of the source s of the transistor 140 is also increased.

In addition, as described above, the operation for compensating the mobility μ of the transistor 140 is continuously executed during the writing period.

At the end of the writing period, the voltage (the holding voltage of the capacitance element 135) between the gate and the source of the transistor 140 is set to a value reflected by the potential Vsig of the data signal Vd(j) and a characteristic (mobility μ) of the transistor 140. Specifically, at the end of the writing period, the voltage Vgs2 between the gate and the source of the transistor 140 will be represented by the following Equation 2:

$$Vgs2 = Vgs1 + \Delta V = Vth\_tr + Va + \Delta V \quad (2)$$

In Equation 2, ΔV is a value according to the potential Vsig and the characteristic (mobility μ) of the transistor 140.

In addition, at the end of the writing period, the difference between the potential of the source s of the transistor 140 and the potential Vct, that is, the voltage across both ends of the light emitting element 150, is set to fall below the light emitting threshold voltage Vth_oled of the light emitting element 150. Accordingly, the light emitting element 150 is in the non-emissive state during the writing period.

If the writing period of i-th row is completed, since the potential Gw(i) of the scanning signal is transitioned to the L level, the transistor 140 is in the OFF state, and thus the gate g is in the floating state. In addition, since the decrease in the potential of the ramp signal Vrmp(i) is completed, the set current flowing in the capacitance element 137 becomes zero.

Herein, since the voltage (the voltage between the gate and the source of the transistor 140) across both ends of the capacitance element 135 is held at the voltage Vgs2 at the end of the writing period, the current according to the voltage Vgs2 flows to the transistor 140, and thus the potential of the source s is increased with the passing of time. Since the gate g of the transistor 140 is in the floating state, the potential of the gate g is increased in conjunction with the potential of the source s.

As a result, the voltage between the gate and the source of the transistor 140 is held at the set voltage Vgs2 at the end of the writing period, and the potential of the source s is increased with a lapse of the time.

At the time when the difference between the potential of the source s and the potential Vet, that is, the voltage across both ends of the light emitting element 150, exceeds the light emitting threshold voltage Vth_oled of the light emitting element 150, the current starts to flow in the light emitting element 150, so that the light emission starts at the luminance according to the current.

Now, supposing a case in which the transistor 140 operates in a saturated region, the current Iel flowing in the light emitting element 150 will be represented by the following Equation 3, in which β is a transistor gain coefficient of the transistor 140:

$$Iel = (\beta/2)(Vgs2 - Vth\_tr)^2 \quad (3)$$

By substitution of Equation 2, Equation 3 will be transformed as follows:

$$Iel = (\beta/2)(Vth\_tr + Va + \Delta V - Vth\_tr)^2$$
$$= (\beta/2)(Va + \Delta V)^2$$

As a result, since the current Iel flowing in the light emitting element is not depending upon the threshold voltage Vth_tr of the transistor 140, even though the threshold voltages Vth_tr are different from each other for every pixel circuit 110, the difference is compensated for, thereby suppressing irregularities in the luminance.

However, in this embodiment, the scanning signal Gw(i) is the L level from the end of the setting period to the start of the writing period during the scanning period of the i-th row, and the transistor 130 is turned off, so that the gate of the transistor 140 is in the floating state.

Herein, since the data line 114 is fluctuated from the initializing potential Vofs to the potential Vsig at the timing Ts, the potential fluctuation is propagated to the gate g and the source s of the transistor 140 via a parasitic capacitance component (not illustrated), and thus fluctuates the voltage Vgs1 set between the gate and the source of the transistor 140 at the end of the setting period. This causes display unevenness or vertical stripes, which becomes a factor of significantly deteriorating the display quality.

Therefore, in this embodiment, by configuring the pixel circuit 110 as follows, it is less susceptible to influence by the potential fluctuation in the data line 114.

The configuration of the pixel circuit 110 will now be described with reference to FIG. 4 to FIG. 6.

Figure 4:
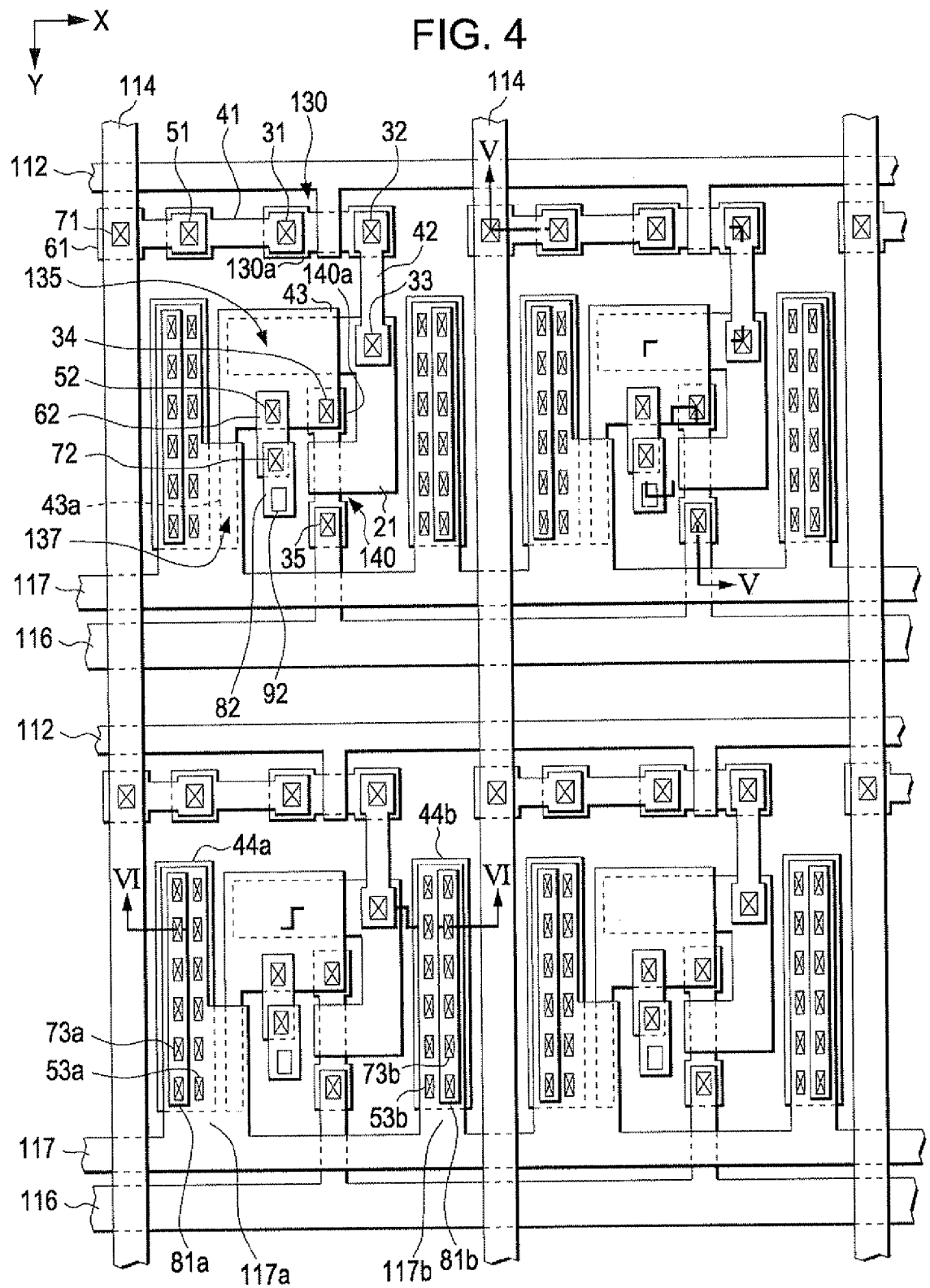
FIG. 4 is a plan view of a main part illustrating the configuration of pixel circuits according to an embodiment.

FIG. 4 is a plan view illustrating the configuration of four pixel circuits 110 adjacent to each other in a vertical and horizontal direction according to an embodiment. FIG. 5 is a partial cross-sectional view illustrating the configuration taken along the line V-V in FIG. 4. FIG. 6 is a partial cross-sectional view illustrating the configuration taken along the line VI-VI in FIG. 5.

FIG. 4 illustrates a wiring structure in a case in which the pixel circuits 110 of a top emission structure are seen in a planar view from a viewer, but, for the sake of simplification, the structure formed after the pixel electrode (anode) in the light emitting element 150 is omitted. FIGS. 5 and 6 illustrate only the pixel electrode of the light emitting element 150, and the subsequent structure is omitted. In addition, for a size sufficient to recognize the respective layers, the respective portions, the respective regions, or the like, there is a case in which a different scale is used in each drawing.

Figure 5:
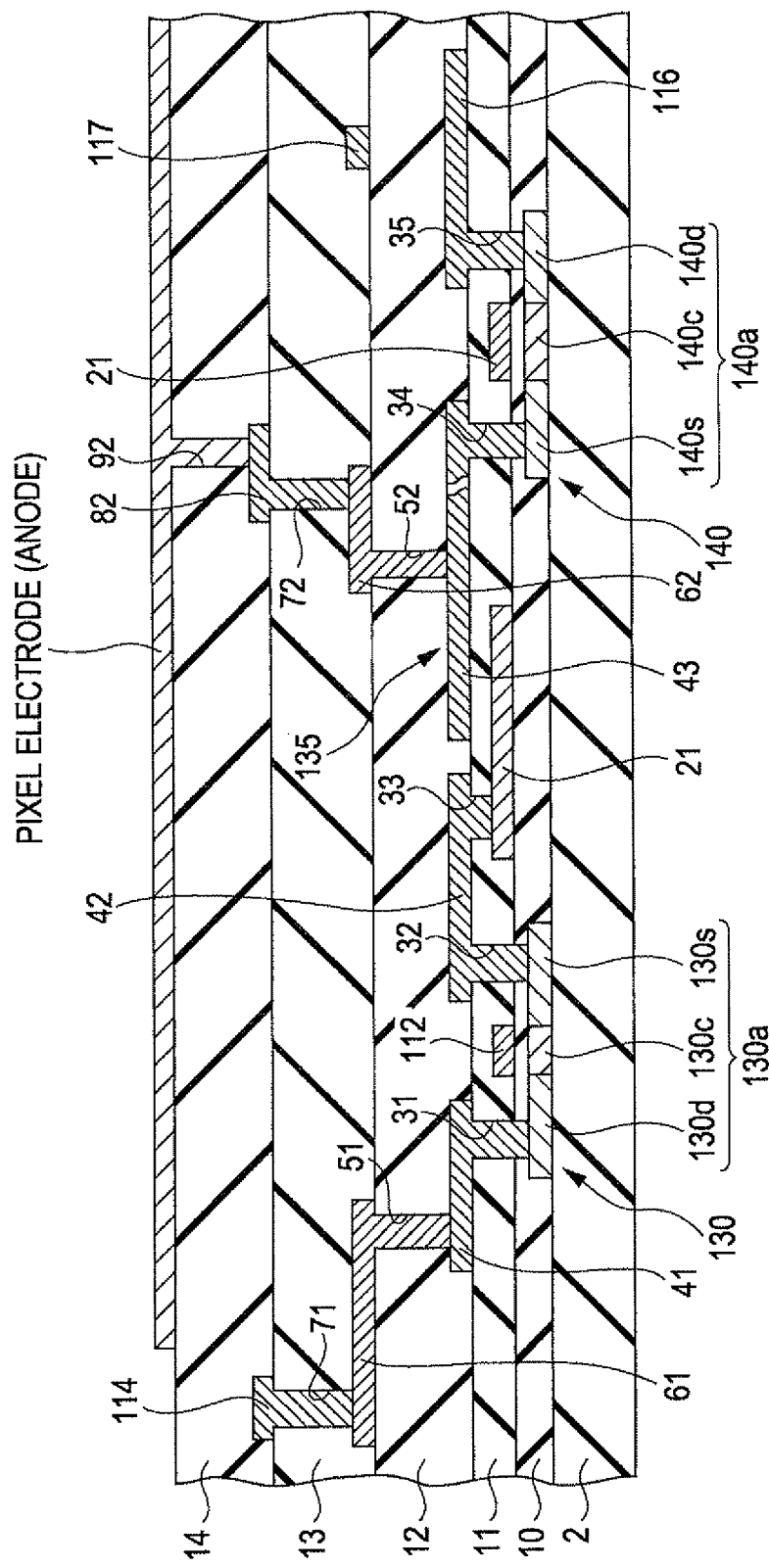
FIG. 5 is a partial cross-sectional view illustrating the configuration taken along the line V-V in FIG. 4.

First, as illustrated in FIG. 5, a poly silicon layer on a substrate body 2 serving as an understructure is patterned in an island shape, and thus semiconductors 130a and 140a are respectively formed thereon. The semiconductor 130a acts as a substrate for configuring the transistor 130, while the semiconductor 140a acts as a substrate for configuring the transistor 140. Herein, as illustrated in FIG. 4, the semiconductor 130a is formed in a rectangular shape having a long side extending in the horizontal direction along the scanning line 112 which is formed later when seen in plan view. Meanwhile, the semiconductor 140a is formed in a rectangular shape having a long side extending in the vertical direction along the data line 114 which is formed later when seen in plan view.

Figure 6:
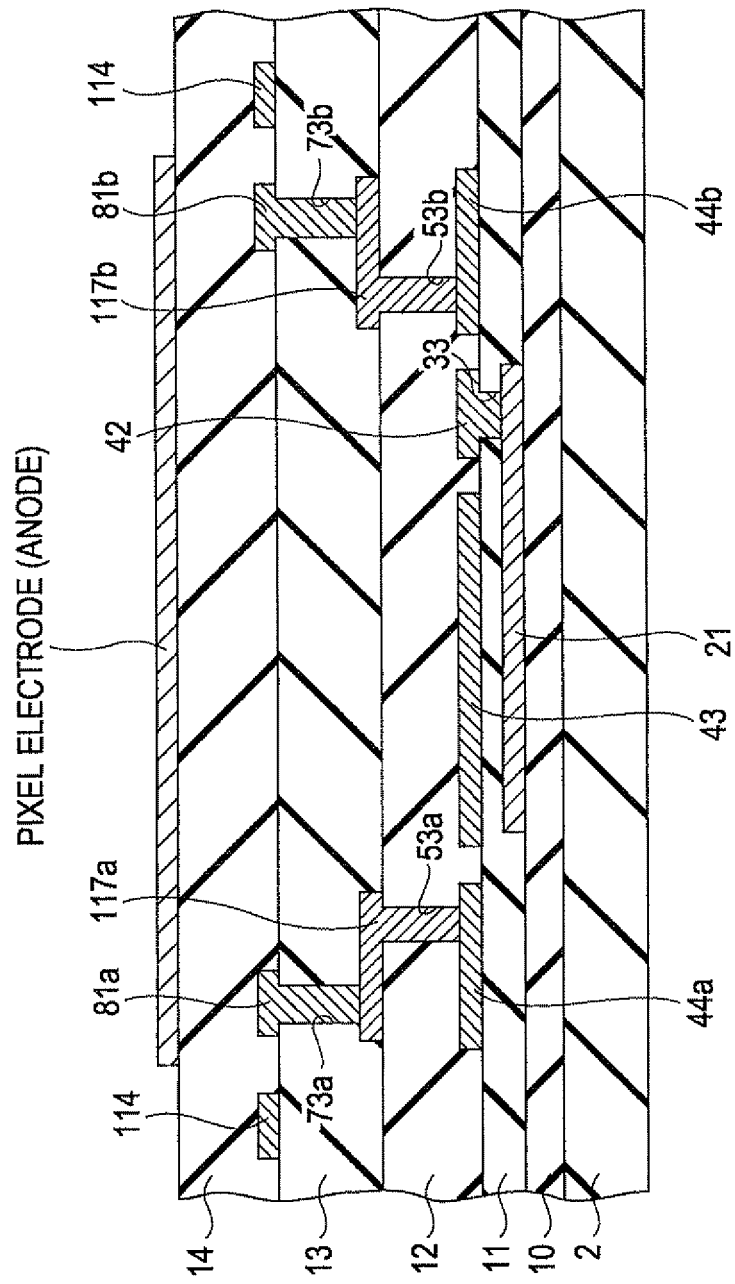
FIG. 6 is a partial cross-sectional view illustrating the configuration taken along the line VI-VI in FIG. 5.

As illustrated in FIGS. 5 and 6, a gate dielectric film 10 is formed to cover almost the entire surface of the semiconductors 130a and 140a. By patterning a gate wiring layer made of molybdenum, poly silicon, or the like, scanning lines 112 and gate electrodes 21 are formed on the surface of the gate dielectric film 10, respectively.

The scanning line 112 is extended in the horizontal direction in FIG. 4, and has a portion branched in a downward direction in the drawing for every pixel circuit 110. The branched portion is overlapped with the center portion of the semiconductor 130a. The region of the semiconductor 130a which is overlapped with the branched portion of the scanning line 112 becomes a channel region 130c (refer to FIG. 5). In addition, with respect to the channel region 130c in the semiconductor 130a, a left side in FIG. 5 is a drain region 130d, while a right side is a source region 130s.

Meanwhile, the gate electrode 21 is formed in a square frame having a top side, a right side, and a bottom side as a unit, with no left side when seen in plan view, as illustrated in FIG. 4. Of these, the bottom side is overlapped with the center portion of the semiconductor 140a, and the region of the semiconductor 140a which is overlapped with the bottom side of the gate electrode 21 becomes a channel region 140c (refer to FIG. 5). With respect to the channel region 140c of the semiconductor 140a, the left side in FIG. 5 is a source region 140s, while the right side is a drain region 140d.

In FIGS. 5 and 6, a first interlayer dielectric film 11 is formed to cover the scanning line 112, the gate electrode 21 or the gate dielectric film 10. Relay electrodes 41, 42, 43, 44a, and 44b and the power line 116 are formed on the surface of the first interlayer dielectric layer 11, respectively, by patterning a conductive wiring layer of aluminum or the like.

Of these, the relay electrode 41 is connected to the drain region 130d via contact holes (via) 31 which respectively open the first interlayer dielectric film 11 and the gate dielectric film 10.

In addition, in FIG. 4, the portion designated by a symbol "☐" with a mark "X" in the portion overlapped with different wiring layers is a contact hole.

In FIG. 5, one end of the relay electrode 42 is connected to the source region 130s via contact holes 32 which respectively open the first interlayer dielectric film 11 and the gate dielectric film 10, while the other end of the relay electrode 42 is connected to the gate electrode 21 via a contact hole 33 which is opened in the first interlayer dielectric film 11.

The relay electrode 43 is connected to the source region 140s via contact holes 34 which respectively open the first interlayer dielectric film 11 and the gate dielectric film 10. As illustrated in FIG. 4, the relay electrode 43 is integrally formed of a rectangular portion covering the top side of three sides of the gate electrode 21 when seen in plan view, and an electrode portion 43a protruding downward from the left end of the rectangular portion. For this reason, the relay electrode 43 is partially overlapped with a portion of the gate electrode 21 when seen in plan view, and serves as a first relay electrode connected to the source of the transistor 140. In addition, the capacitance element 135 is configured in such a way that the first interlayer dielectric film 11 is interposed between the gate electrode 21 and the relay electrode 43, as illustrated in FIG. 5.

As illustrated in FIG. 4, the relay electrode 44a is provided between the j-th column data line 114 which will be formed later, and the relay electrode 43 in the j-th column when seen in plan view, and is formed in a rectangular shape having a long side extending in the vertical direction.

As illustrated in FIG. 4, the relay electrode 44b is provided between the (j+1)-th column data line 114 and the gate electrode 21 in the j-th column when seen in plan view, and is formed in a rectangular shape having a long side extending in the vertical direction.

The power line 116 is extended in the horizontal direction in FIG. 4, and has a portion, which is branched in an upward direction in the drawing, for every pixel circuit 110. A front end of the branched portion is connected to the drain region 140d via contact holes 35 which respectively open the first interlayer dielectric film 11 and the gate dielectric film 10 (refer to FIG. 5).

In FIGS. 5 and 6, a second interlayer dielectric film 12 is formed to cover the relay electrodes 41, 42, 43, 44a, and 44b, the power line 116, or the first interlayer dielectric film 11. By patterning a conductive wiring layer of aluminum or the like, relay electrodes 61 and 62 and a feed line 117 are respectively formed on the surface of the second dielectric film 12.

Of these, the relay electrode 61 is connected to the relay electrode 41 via a contact hole 51 which opens the second interlayer dielectric film 12. The relay electrode 62 is also connected to the relay electrode 43 via a contact hole 52 which is opened in the second interlayer dielectric film 12.

The feed line 117 is extended in the horizontal direction between the transistor 140 and the power line 116 in FIG. 4 when seen in plan view, and has electrode portions 117a and 117b branched in an upward direction in the drawing for every pixel circuit 110.

Of these, the electrode portion 117a is formed to cover the relay electrode 44a and the electrode portion 43a, and is connected to the relay electrode 44a via a plurality of contact holes 53a which are opened in the second interlayer dielectric film 12 (refer to FIG. 6).

In addition, the capacitance element 137 is formed in such a way that the second interlayer dielectric film 12 is interposed between the electrode portion 43a of the relay electrode 43 and the electrode portion 117a, which is not illustrated in the drawings.

Meanwhile, the electrode portion 117b is formed to cover the relay electrode 44b, and is connected to the relay electrode 44b via a plurality of contact holes 53b which are opened in the second interlayer dielectric film 12 (refer to FIG. 6). This allows the relay electrode 44b to electrically connect to the feed line 117.

In FIGS. 5 and 6, a third interlayer dielectric film 13 is formed to cover the relay electrodes 61 and 62, the feed line 117, or the second interlayer dielectric film 12. By patterning a conductive wiring layer of aluminum or the like, a data line 114 and relay electrodes 81a, 81b, and 82 are respectively formed on the surface of the third dielectric film 13.

Of these, the data line 114 is connected to the relay electrode 61 via a contact hole 71 which is opened in the third interlayer dielectric film 13 (refer to FIG. 5). For this reason, the data line 114 is connected to the drain region 130d following a course of the relay electrode 61 and the relay electrode 41. Herein, as illustrated in FIG. 4, the data line 114 is formed in the vertical direction perpendicular to the extending direction of the scanning line 112 when seen in plan view.

In the j-th column, as illustrated in FIG. 4, the relay electrode 81a is formed to be overlapped with the relay electrode 44a and the electrode portion 117a between the j-th column data line 114 and the relay electrode 43/gate electrode 21 when seen in plan view. The relay electrode 81a is connected to the electrode portion 117a via a plurality of contact holes 73a which are opened in the third interface dielectric film 13, as illustrated in FIG. 6. For this reason, the relay electrode 81a can serve as the second relay electrode.

Herein, when the vicinity of the relay electrode 81a corresponding to the j-th column is seen in cross-section, the following structure is formed. That is, as illustrated in FIG. 6, since the lower side of the electrode portion 117a is connected to the relay electrode 44a located at the same layer as the relay electrode 43 via the contact hole 53a, and the upper side of the electrode portion 117a is connected to the relay electrode 81a located at the same layer as the data line 114 via the contact hole 73a, a structure is formed in which the relay electrode 43/gate electrode 21 is electrically shielded from the j-th column data line 114.

In the j-th column, as illustrated in FIG. 4, the relay electrode 81b is formed to be overlapped with the relay electrode 44b and the electrode portion 117b between the (j+1)-th column data line 114 and the relay electrode 42/gate electrode 21 when seen in plan view. The relay electrode 81b is connected to the electrode portion 117b via a plurality of contact holes 73b which are opened in the third interface dielectric film 13, as illustrated in FIG. 6. For this reason, the relay electrode 81b can serve as the second relay electrode.

Herein, when the vicinity of the relay electrode 81b corresponding to the j-th column is seen in cross-section, the following structure is formed. That is, as illustrated in FIG. 6, since the lower side of the electrode portion 117b is connected to the relay electrode 44b located at the same layer as the relay electrode 42(43) via the contact hole 53b, and the upper side of the electrode portion 117b is connected to the relay electrode 81b located at the same layer as the data line 114 via the contact hole 73b, a structure is formed in which the relay electrode 42(43)/gate electrode 21 is electrically shielded from the (j+1)-th column data line 114.

In addition, the relay electrode 44a is made from the same wiring layer as the relay electrode 43. Since the relay electrode 44a is overlapped with the relay electrode 81a as the second relay electrode when seen in plan view, the relay electrode 44a can serve as the third relay electrode. The same is also applied to the relay electrode 44b.

The relay electrode 82 is connected to the relay electrode 62 via a contact hole 72 which is opened in the third interlayer dielectric film 13, as illustrated in FIG. 5.

A fourth interlayer dielectric layer 14 is formed to cover the data line 114, the relay electrodes 81a, 81b, and 82, or the third interlayer dielectric film 13. By patterning a conductive wiring layer of aluminum, indium tin oxide (ITO), or the like, an anode of the light emitting element 150 is formed on the surface of the fourth interlayer dielectric film 14. The anode is a separate pixel electrode for every pixel circuit 110, and is connected to the relay electrode 82 via a contact hole 92 which is opened in the fourth interlayer dielectric film 14. For this reason, the anode (pixel electrode) is connected to the source region 140s along a route of the relay electrode 82, the relay electrode 62, and the relay electrode 43 combined with the other electrode of the capacitance element 135.

Although the subsequent structure of the electro-optical device 1 is not illustrated, a light emitting layer made of an organic EL material is layered on the anode for every circuit 110, and a common transparent electrode and a common electrode 118 serving as a cathode are provided over the respective pixel circuits 110. Thus, the light emitting element 150 becomes an OLED with the light emitting layer being interposed between the anode and the cathode facing each other, and emits light at a luminance according to the current flowing from the anode to the cathode, which is observed toward a direction opposite to the substrate body 2 (top emission structure). Besides this, a sealant for shielding the light emitting layer from atmosphere, or the like is provided, but the description thereof will be omitted herein.

In addition, FIG. 4 does not illustrate the pixel electrode which is the anode of the light emitting element 150. For this reason, since FIG. 4 illustrates only the lower layer side of the contact hole 92, the lower layer side is represented only by the symbol "☐" to be distinguished from other contact holes.

Before the effect resulted from by providing the structure including the electrode portions 117a and 117b is mentioned in the electro-optical device 1 according to the embodiment, a problem contained in a comparative example with no such a structure will be described.

FIG. 14 is a plan view to illustrating the configuration of pixel circuits according to a comparative example. FIG. 15 is a partial cross-sectional view illustrating the configuration taken along the line XV-XV in FIG. 14.

As illustrated in FIG. 14, the comparative embodiment does not include the relay electrode 81a(81b) example the relay electrode 44a(44b), like the embodiment illustrated in FIG. 4, and the feed line 117 is not branched in the upward direction in the drawing.

For this reason, if the potential of the data line 114 is fluctuated, the potential fluctuation is propagated to the gate electrode 21 or the relay electrodes 42 and 43, as illustrated in FIG. 15. The gate electrode 21 is the gate g of the transistor 140, the relay electrode 42 is connected to the gate electrode 21 via the contact hole 33, and the relay electrode 43 is connected to the source region of the transistor 140.

Accordingly, when being viewed in any j-th column pixel circuit 110, if the potential of the (j+1)-th column data line 114 adjacent to the j-th row pixel circuit is fluctuated, as well as the j-th column data line corresponding to itself, the potential fluctuation is propagated to the gate electrode 21 or the relay electrodes 42 and 43, thereby fluctuating the voltage set between the gate and the source of the transistor 140 which is a cause of significantly decreasing the display quality.

On the other hand, according to this embodiment, as illustrated in FIG. 4 or FIG. 6, the gate electrode 21 and the relay electrode 43 are respectively shielded from the j-th column data line 114 by the following structure, whether seen in plan view or in cross-section. That is, there is a structure in which the relay electrode 81a, the electrode portion 117a branched from the feed line 117, and the relay electrode 44a are electrically connected to each other by the contact holes 73a and 53a to be held at the same potential. In addition, the shield effect can be obtained from any one of the relay electrode 81a, the electrode portion 117a, and the relay electrode 44a, but the shield effect can be improved by two or three elements.

In the similar way, the gate electrode 21 and the relay electrodes 42 and 43 are respectively shielded from the (j+1)-th column adjacent data line 114, whether seen in plan view or in cross-section, by the structure in which the relay electrode 81b, the electrode portion 117b branched from the feed line 117, and the relay electrode 44b are electrically connected to each other by the contact holes 73b and 53b to be held at the same potential. In addition, the shield effect can be obtained from any one of the relay electrode 81b, the electrode portion 117b, and the relay electrode 44b, but the shield effect can be improved by two or three elements.

In this embodiment, even though the potential of the j-th and (j+1)-th column data lines 114 fluctuates, the potential fluctuation is hardly propagated to the gate electrode 21 and the relay electrodes 42 and 43, thereby preventing the deterioration in the display quality.

The invention is not limited to the above-described embodiment, but the following application and variation can be made.

Figure 7:
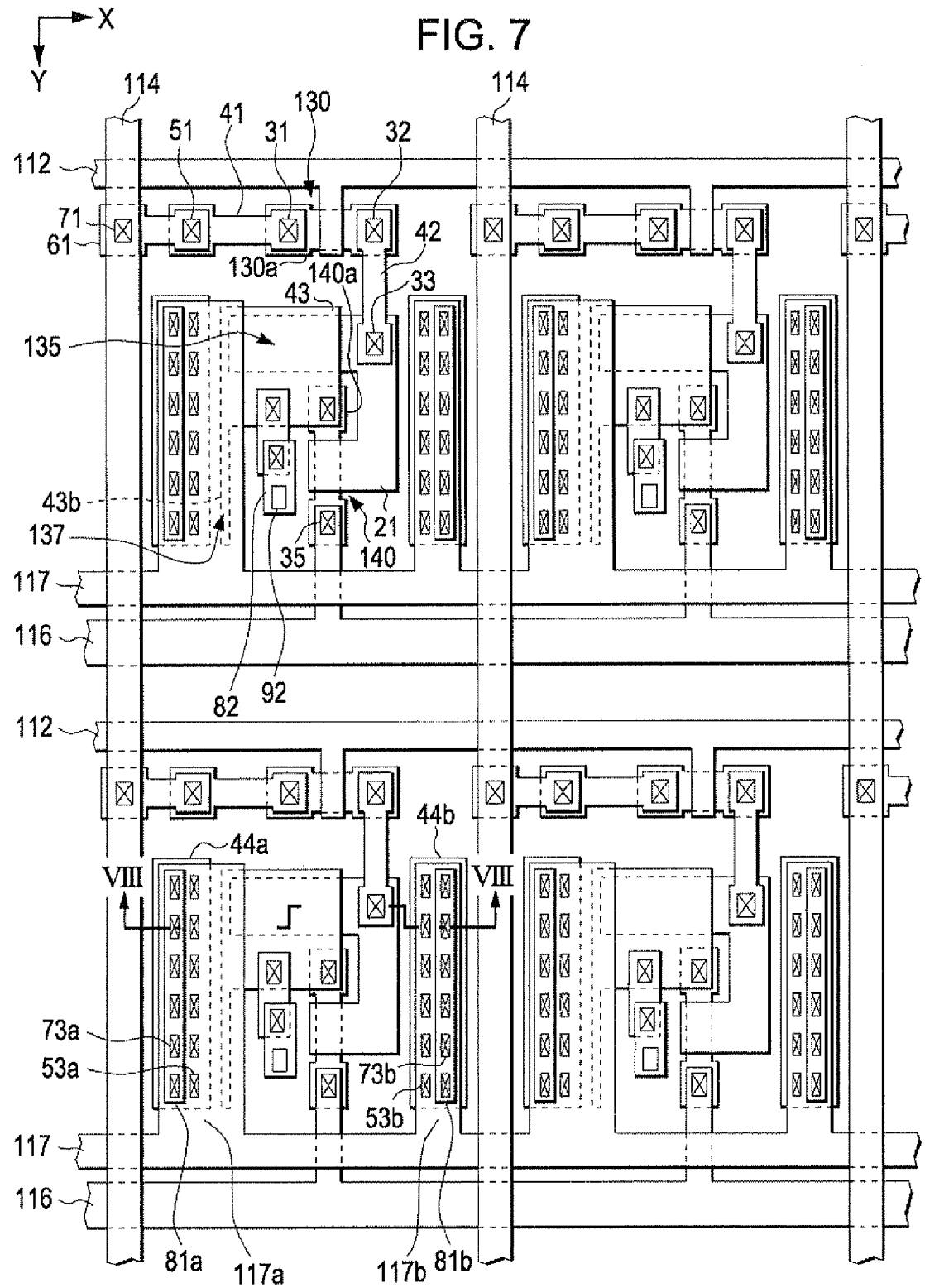
FIG. 7 is a plan view of a main part illustrating the configuration of pixel circuits according to a first application mode.
Figure 8:
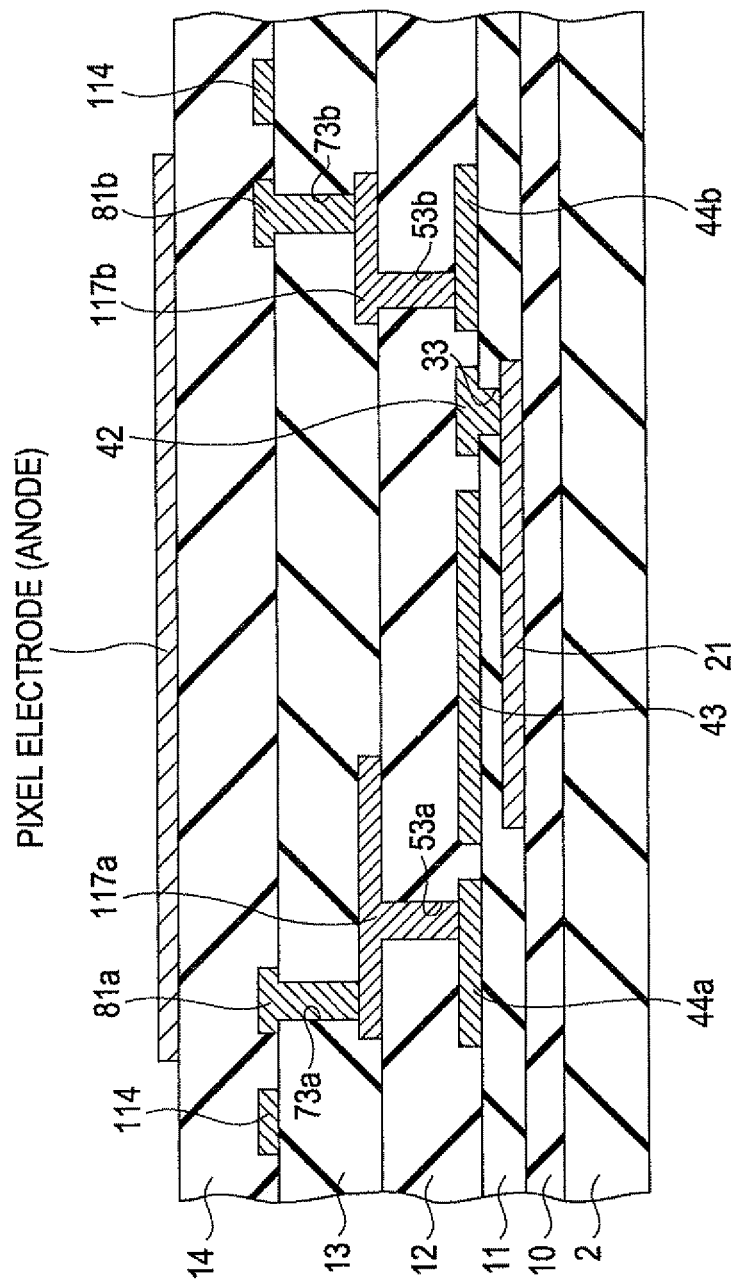
FIG. 8 is a partial cross-sectional view illustrating the configuration taken along the line VIII-VIII in FIG. 7.

FIG. 7 is a plan view illustrating the configuration of a pixel circuit 110 according to a first application mode. FIG. 8 is a partial cross-sectional view taken along the line VIII-VIII in FIG. 7.

As illustrated in the drawings, even a configuration, in which the electrode portion 117a branched from the feed line 117 is extended when seen in plan view until being overlapped with the gate electrode 21, is advantageous. With such a configuration, since an area of shielding the gate electrode 21 and the relay electrode 43 from the j-th column data line 114 is increased when seen from the j-th column pixel circuit 110, it can reliably prevent the deterioration in the display quality.

In addition, in the configuration, the overlapped area of the relay electrode 43 and the electrode portion 117 is increased only by simply extending the electrode portion 117a, the capacity of the capacitance element 137 is increased in comparison with the configuration illustrated in FIG. 4. Accordingly, a balance is promoted by making a width of the electrode portion 43a in the horizontal direction in FIG. 7 narrower than the width illustrated in FIG. 4.

However, since the relay electrodes 81a and 81b are made of the same conductive layer as the data line 114, the relay electrodes are necessary to be formed electrically independently from the respective data lines 114. Meanwhile, since the feed line 117 and the relay electrodes 44a and 44b are made of a conductive layer different from the respective data lines 114, the feed line and the relay electrodes are electrically separately formed from other relay electrode or other wiring made of the same conductive layer, there is no problem even though they intersect with the data line 114 when seen in plan view.

Figure 9:
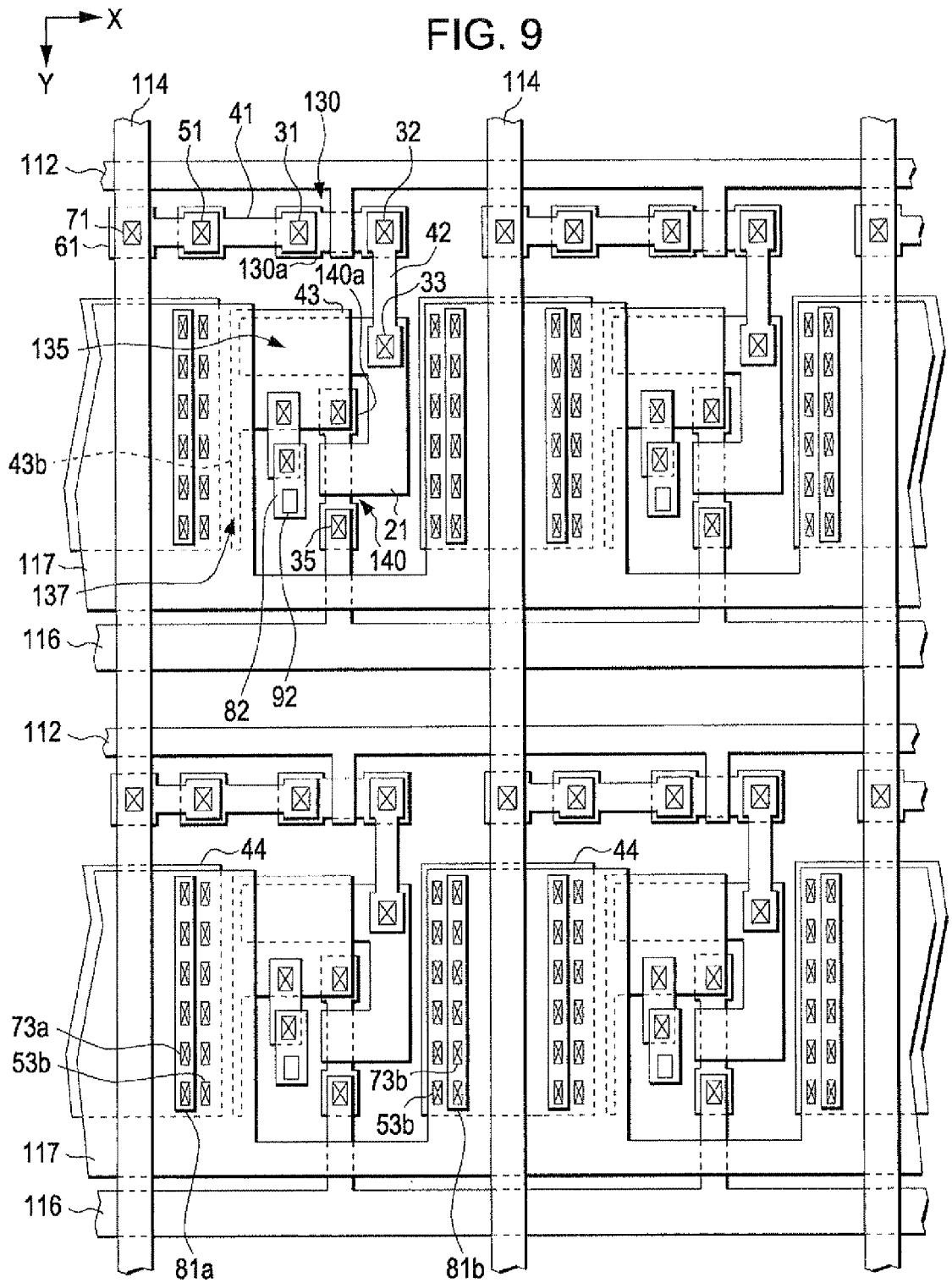
FIG. 9 is a plan view of a main part illustrating the configuration of pixel circuits according to a second application mode.

For this reason, as a second application mode illustrated in FIG. 9, the feed line 117 may be patterned without scraping off the portion intersected with the data line 114. In addition, the relay electrodes 44a and 44b may be integrated to serve as the relay electrode 44.

Figure 10:
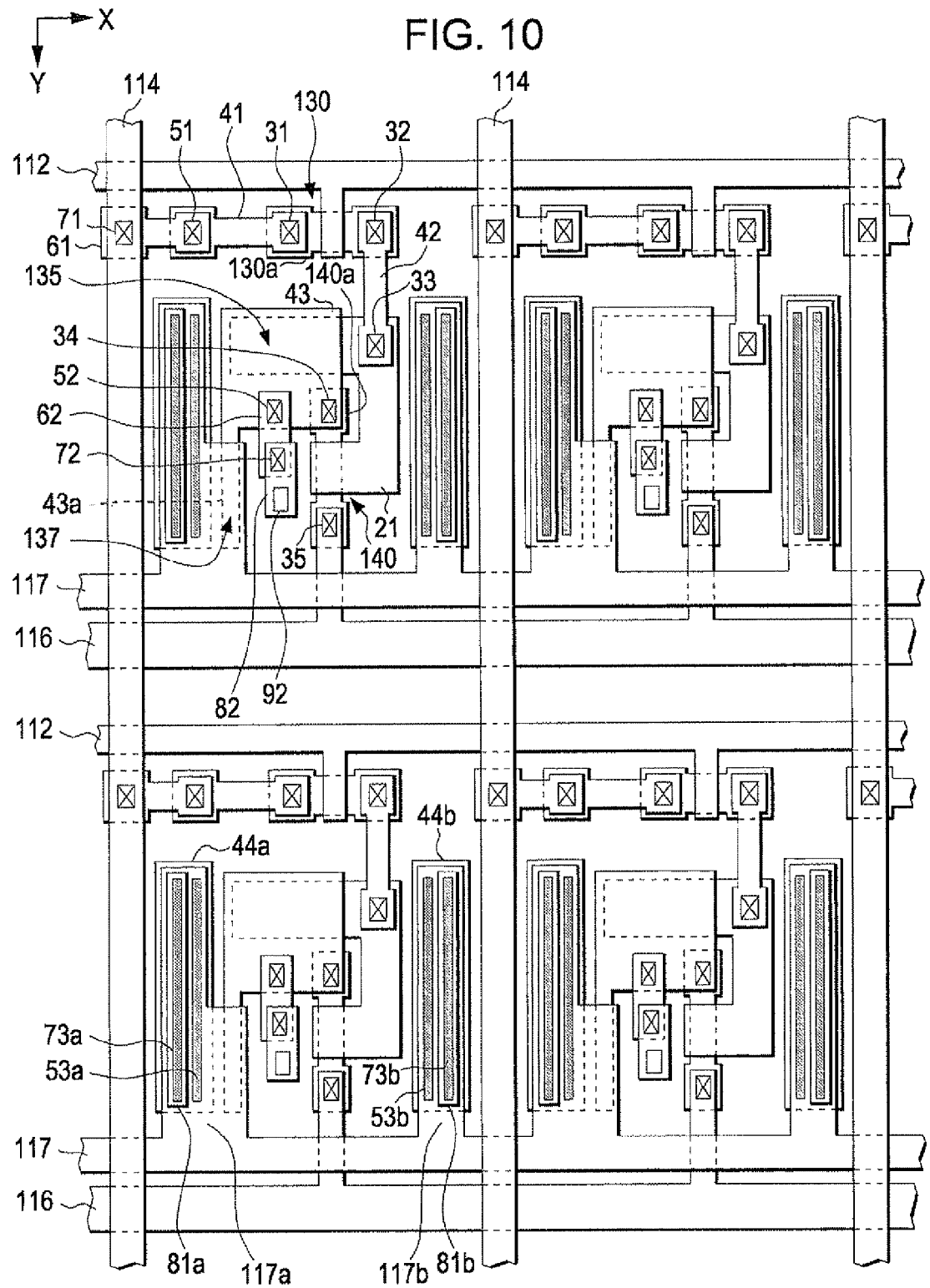
FIG. 10 is a plan view of a main part illustrating the configuration of pixel circuits according to a third application mode.

In addition, although the contact holes 53a, 53b, 73a, and 73b are provided in plural in this embodiment, for example, the contact holes may be continuously formed over the hatched region, like a third application mode illustrated in FIG. 10. If the contact holes are formed in this way, it is possible to reliably suppress the potential fluctuation in the data line 114 from being propagated to the relay electrodes 42 and 43 and the gate electrode 21 through an interface between the contact holes.

Although the potential of the ramp signal supplied to the feed line 117 is linearly decreased in this embodiment, the present is not limited thereto, and an aspect of the fluctuation in the potential output from the feed line 117 is arbitrary. For example, the waveform of the potential output to the feed line 117 may be a curve. In conclusion, if the set current flows in the transistor 140, the potential output to the feed line 117 may be varied with a lapse of a time from the setting period to the writing period. In addition, if the compensation of the mobility is treated as unimportant, since it is less necessary to drain the set current, it may be configured to set the feed line 117 to constant potential, that is, it may be configured to supply DC.

In a case in which the scanning line 112 is patterned by the wiring layer configuring the pixel electrode (anode), or a wiring layer positioned at the upper layer side opposite to the substrate body 2 rather than the wiring layer, it may be configured to pattern the feed line 117 so that the scanning line and the gate/source of the transistor 140 are overlapped with each other whether seen in plan view or in cross-section. According to this configuration, it is possible to suppress the fluctuation of the potential in the scanning line supplied to the scanning line 112 from being propagated to the gate/source of the transistor 140.

As the light emitting element 150, other elements emitting at the luminance according to the current, such as inorganic EL elements, light emitting diodes (LED), can be applied, in addition to the OLED.

Next, examples of an electronic apparatus using the electro-optical device 1 according to the embodiment will now be described.

Figure 11:
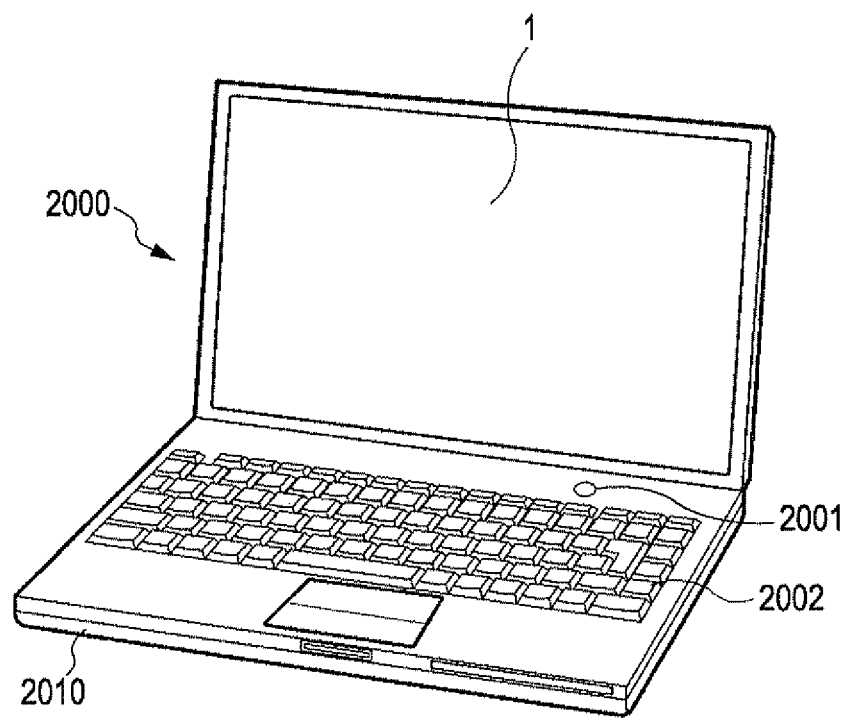
FIG. 11 is a diagram illustrating a first example of an electronic apparatus to which an electro-optical device is applied.

FIG. 11 is a diagram illustrating an appearance of a personal computer as a first example of the electronic apparatus in which the electro-optical device 1 according to the above-described embodiment is applied to a display device. A personal computer 2000 includes a body section 2010 as the electro-optical device 1 serving as the display device. The body section 2010 is provided with a power switch 2001 and a key board 2002.

If the OLED is used for the light emitting element 150 in the electrical-optical device 1, the viewing angle is wide, so that it is possible to easily see the screen display.

Figure 12:
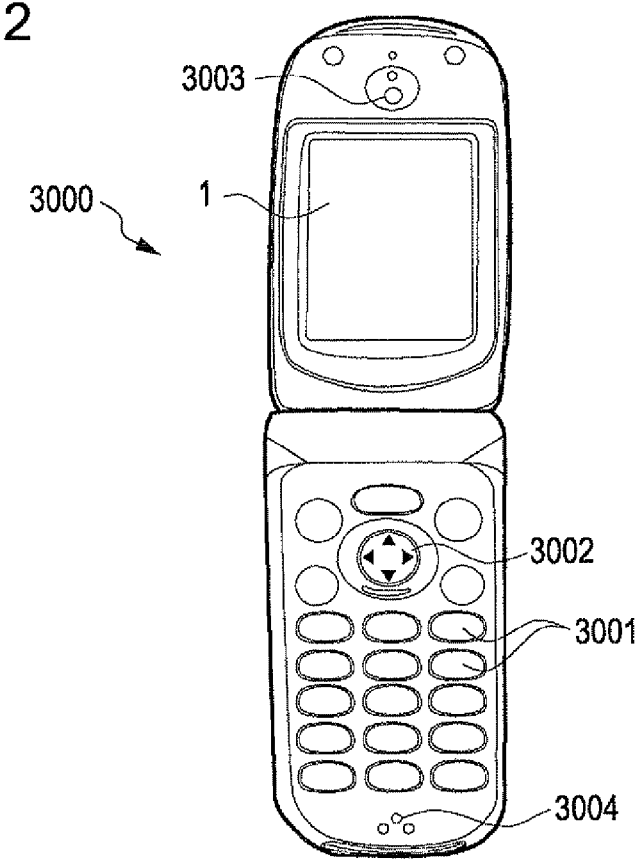
FIG. 12 is a diagram illustrating a second example of an electronic apparatus to which an electro-optical device is applied.

FIG. 12 is a diagram illustrating an appearance of a cellular phone as a second example of the electronic apparatus in which the electro-optical device 1 according to the above-described embodiment is applied to a display device. The cellular phone 3000 includes an ear piece 3003, a mouthpiece 3004, and the above-mentioned electro-optical device 1, in addition to a plurality of operation buttons 3001 or arrow keys 3002. The screen displayed on the electro-optical device 1 is scrolled by manipulating the arrow keys 3002.

Figure 13:
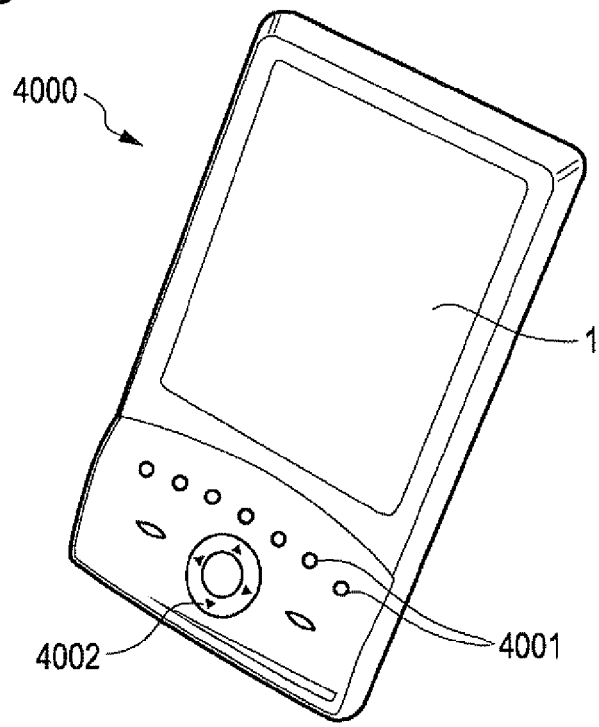
FIG. 13 is a diagram illustrating a third example of an electronic apparatus employing an electro-optical device.

FIG. 13 is a diagram illustrating an appearance of a personal digital assistant (PDA) as a third example of the electronic apparatus in which the electro-optical device 1 according to the above-described embodiment is applied to a display device. A personal digital assistant 4000 includes the above-mentioned electro-optical device 1, in addition to a plurality of operation buttons 4001 or arrow keys 4002. In the personal digital assistant 4000, information such as an address book or a date book is displayed on the electro-optical device 1 through desired manipulation, and simultaneously, the displayed information is scrolled by manipulation of the arrow keys 4002.

In addition the electronic apparatus, to which the electro-optical device is applied, according to the invention includes a television set, a car navigation device, a pager, an electronic notebook, an electronic paper, an electronic calculator, a word processor, a workstation, a video phone, a POS terminal, a printer, a scanner, a copying machine, a video player, and an appliance having a touch panel, in addition to the examples illustrated in FIG. 11 to FIG. 13. In particular, a micro display includes a head mounted display, and an electronic view finder, such as for a digital still camera or a video camera.

The entire of Japanese Patent Application No. 2011-124197, filed Jun. 2, 2011 is expressly incorporated by reference herein.

What is claimed is:

1. An electro-optical device comprising:
   a scanning line and a data line that intersect one another; and
   a pixel circuit that is disposed in correspondence to an intersection of the scanning line and the data line,
   the pixel circuit including a driving transistor supplying a current according to a voltage between a gate and a source to the source from a drain,
   a switching transistor electrically connected between the gate of the driving transistor and the data line,
   a first capacitor holding a voltage between the gate and the source of the driving transistor,
   a light emitting element having an anode which is connected to the source of the driving transistor, and emitting light according to the current flowing from the anode to a cathode, and
   a second capacitor having one end connected to the source of the driving transistor and the other end connected to a feed line,
   a first relay electrode that is overlapped with a portion of a gate electrode forming the gate of the driving transistor, and electrically connected to the source of the driving transistor when seen in plan view, and
   the feed line being made of a wiring layer between a wiring layer forming the gate of the driving transistor and a wiring layer forming the data line, and having an electrode portion located between the data line and the gate of the driving transistor when seen in plan view,
   an electrode portion of the feed line being overlapped with a portion of the first relay electrode when seen in plan view, the first capacitor interposing a first interlayer dielectric film between the gate electrode and the first relay electrode, and the second capacitor interposing a second interlayer dielectric film between the first relay electrode and the electrode portion of the feed line.

2. The electro-optical device according to claim 1, wherein during an initializing period, a potential of the drain of the driving transistor is set to a first power potential, and the gate of the driving transistor is supplied with an initializing potential via the data line and the switching transistor to initialize a potential of the source of the driving transistor, during a setting period, a potential of the power line is set to a second power potential to hold a voltage corresponding to a threshold voltage of the driving transistor between the gate and the source of the driving transistor in a state in which the light emitting element does not emit light, during a writing period, the gate of the driving transistor is supplied with a potential corresponding to a gradation via the data line and the switching transistor, and a set current flows in the second capacitor at least from the setting period to the writing period.

3. An electronic apparatus comprising the electro-optical device according to claim 2.

4. An electronic apparatus comprising the electro-optical device according to claim 1.

5. An electro-optical device comprising:
a scanning line and a data line that intersect one another; and
a pixel circuit that is disposed in correspondence to an intersection of the scanning line and the data line,
the pixel circuit including a light emitting element,
a driving transistor supplying a current to the light emitting element,
a switching transistor electrically connected between a gate of the driving transistor and the data line,
a first capacitor holding a potential of the gate of the driving transistor, and
a second capacitor having one end connected to the source of the driving transistor and the other end connected to a feed line, a first relay electrode that is overlapped with a portion of a gate electrode forming the gate of the driving transistor, and electrically connected to the source of the driving transistor when seen in plan view, and the feed line being made of a wiring layer between a first wiring layer forming the gate of the driving transistor and a second wiring layer forming the data line, and having a portion located between the data line and the gate of the driving transistor when seen in plan view, an electrode portion of the feed line being overlapped with a portion of the first relay electrode when seen in plan view, the first capacitor interposing a first interlayer dielectric film between the gate electrode and the first relay electrode, and the second capacitor interposing a second interlayer dielectric film between the first relay electrode and the electrode portion of the feed line.

6. The electro-optical device according to claim 5, further comprising:
a second relay electrode that is formed of a wiring layer forming the data line, and provided between the data line and the gate electrode when seen in plan view,
wherein the second relay electrode is electrically connected to the electrode portion of the feed line via a contact hole.

7. The electro-optical device according to claim 6, further comprising:
a third relay electrode that is formed of the same layer as the first relay electrode, and is overlapped with the second relay electrode when seen in plan view,
wherein the third capacitor is electrically connected to the electrode portion of the feed line via a contact hole.

8. An electronic apparatus comprising the electro-optical device according to claim 7.

9. An electronic apparatus comprising the electro-optical device according to claim 5.

10. An electronic apparatus comprising the electro-optical device according to claim 6.

* * * * *